United States Patent [19]

Kosaka

[11] Patent Number: 5,361,273
[45] Date of Patent: Nov. 1, 1994

[54] SEMICONDUCTOR OPTICAL SURFACE TRANSMISSION DEVICE

[75] Inventor: Hideo Kosaka, Tokyo, Japan
[73] Assignee: NEC Corporation, Tokyo, Japan
[21] Appl. No.: 145,505
[22] Filed: Nov. 4, 1993
[30] Foreign Application Priority Data Nov. 4, 1992 [JP] Japan .................. 4-295035

[51] Int. Cl.$^5$ ............................................. H01S 3/19
[52] U.S. Cl. .................................. 372/50; 372/96;
 257/85; 257/84; 257/97
[58] Field of Search ............... 372/50, 96, 45; 257/80,
 257/82, 83-85, 96, 97

[56] References Cited

U.S. PATENT DOCUMENTS

| 4,969,152 | 11/1990 | Burghardt et al. | 257/80 |
| 5,014,096 | 5/1991 | Matsuda et al. | 257/83 |
| 5,283,447 | 2/1994 | Olbright et al. | 372/50 |

FOREIGN PATENT DOCUMENTS

| 0204574 | 11/1983 | Japan | 257/80 |
| 4-101483 | 4/1992 | Japan . | |

OTHER PUBLICATIONS

By Y. Lee et al., "Active Optical NOR Logic Devices Using Surface-Emitting Lasers", May 1992, vol. 4, No. 5, IEEE Photonics Technology Letters, pp. 479-482.
By G. Olbright et al., "Cascadable Laser Logic Devices: Discrete Integration of Phototransistors with Surface-Emitting Laser Diodes", Jan. 1991, vol. 27, No. 3, Electronics Letters, pp. 216-217.

Primary Examiner—Georgia Y. Epps
Attorney, Agent, or Firm—Young & Thompson

[57] ABSTRACT

The invention provides a semiconductor optical surface transmission device comprising a laser element and a photo-transistor element formed on a semiconductor substrate through which light transmissions are made. Each of the laser element and the photo-transistor element has top and bottom reflective mirrors, but the bottom reflective mirror of the photo-transistor element includes a phase inversion layer to form a double resonator for detecting injection lights in a wide range of those wavelength at a high efficiency of absorption of the injection lights.

7 Claims, 7 Drawing Sheets

Light Transmission

SEMICONDUCTOR OPTICAL SURFACE TRANSMISSION DEVICE

BACKGROUND OF THE INVENTION

The invention relates to a semiconductor optical integrated device, and more particularly to a semiconductor optical integrated device comprising a surface emitting laser element and a photo detecting element, which is usable for parallel optical processing or optical computing applications and parallel optical transmissions.

As high density and high speed parallel optical processing and transmissions are required, the value and importance of improvement in properties of the optical devices used therefor will be on the increase. A possibility of realization of ideal high density and high speed parallel optical processing and transmissions with a great stability of operations thereof depends upon properties of the device such as a high speed performance and a great stability of operations as well as an allowability of a two-dimensional integration of optical device array at a high density and other various factors.

Implementation of the two-dimensional integration of the optical device array requires the optical device to have a structure for surface transmissions of light. The high density integration of the optical device array also requires the optical device to have a heat radiation structure or a structure for removal of unnecessary heat accumulation caused by laser emission and electrical and optical currents flowing through the semiconductor optical device. As the high density of the optical device array is improved, the problem with the heat accumulation in the optical device becomes more serious. Much more improvement in the high density of the optical device array further needs not only the removal of the heat from the optical device but also a possible suppression or reduction of unnecessary electrical and optical currents flowing through the optical device. The reduction of the electrical and optical currents flowing through the optical device may be required by a low threshold current of the surface emitting laser element and great efficiencies of light absorption and light emission of the photo detecting element and the surface emitting laser element respectively. Needless to say, it is important to make a possible minimization of size of the optical device for improvement in the high density of the two-dimensional optical device array.

The low threshold current of the surface emitting laser element permits the optical device to exhibit an improved high speed performance of the operation. The minimization of the size of the optical device also permits a high speed performance of the operation of the optical device.

The stability of the operation of the optical device is essential to secure ideal parallel optical processing and parallel optical transmissions. One of the main factors of instability of the operation of the optical device is in instability of detecting operation of the photo detecting element. Normally, the photo detecting element such as heterojunction photo transistor is also designed to make an absorption of a light having a predetermined wavelength. Actually, a light to be injected into the photo detecting element necessarily has somewhat of variation from the predetermined wavelength. The variation of the wavelength of the light to be injected into the photo detecting element in the optical device causes the instability of the operation of the optical device. Then, such an ideal optical device as having a stability of the operation is sought to include the photo detecting element sensitive to a wide-range of the wavelength of the injection light. It is thus ideal that the photo detecting element is so designed as able to make an absorption of injection lights having a wide-range wavelength but at a possible high absorption efficiency.

Various semiconductor optical devices for emitting and detecting lighs have been developed to be used for the parallel optical processing and the parallel optical transmissions. One of the conventional semiconductor optical device for emitting and detecting lights is disclosed in the Japanese Laid-open Patent Application No. 4-101483 laid open on Apr. 2, 1992, which will be described with reference to FIG. 1.

FIG. 1 is a cross sectional elevation view illustrative of a vertical-to-surface transmission electro-hotonic device with a vertical cavity. The vertical-to-surface transmission electro-hotonic device comprises an n-type GaAs substrate 21, n-type bottom and p-type top distributed Bragg reflectors 22 and 28 and an intermediate layer. The n-type bottom distributed Bragg reflector 22 is formed on the n-type GaAs substrate and comprises 14.5 pairs of alternative laminations of n-GaAs layers 29 and n-AlAs layers 30. The n-GaAs layer and the n-AlAs layers are so designed as to have thicknesses of approximately 672 angstroms and approximately 804 angstroms respectively. The p-type top distributed Bragg reflector 28 is formed on the intermediate layer and comprises 15 pairs of alternative laminations of p-GaAs layers 31 and p-AlAs layers 32. The p-GaAs layer 31 and the p-AlAs layer are so designed as to have thicknesses of approximately 672 angstroms and approximately 804 angstroms respectively. The intermediate layer is sandwiched between the top and bottom distributed Bragg reflectors 28 and 22 serving as reflecting mirrors and comprises bottom and top guide layers and an active layer 25 sandwiched between the guide layers. The bottom guide layer comprises a p-GaAs layer 23 formed on a top surface of the n-type bottom distributed Bragg reflector 22 and an i-GaAs layer 24 formed on the p-GaAs layer 23. The top guide layer comprises an n-GaAs layer 27 formed on a bottom surface of the p-type top distributed Bragg reflector 28 and an i-GaAs layer 26 formed on a bottom surface of the n-GaAs layer 27. The active layer 25 is made of $In_{0.2}Ga_{0.8}As$ having a smaller energy band gap than that of the i-GaAs layers 24 and 26 sandwiching the active layer 25 so that the top and bottom guide layers may serve as potential barriers to make electrical and optical confinements in the active layer 25. The vertical-to-surface transmission electrohotonic device with a vertical cavity is biased through top and bottom electrodes 34 and 23 which are provided on a top surface of the p-type top distributed Bragg reflector 28 and on a bottom surface of the n-GaAs substrate 21 respectively, The intermediate layer is so designed as to have a thickness of approximately integer times of a wavelength within medium of laser oscillation. When the cavity length is 9500 angstroms, the thickness of the intermediate layer is approximately 0.3 micrometers.

The vertical-to-surface transmission electro-photonic device with a cavity resonator may be considered as a thyristor. Transmissions of lights or light injection and emission are accomplished though the n-GaAs substrate 21. An injected light through the n-GaAs substrate 21 shows a cavity resonance only when the cavity length defined by the distance between the top and bottom reflective mirrors or the distributed Bragg reflectors 22 and 28 is approximately integer times of a wavelength of the injected light. This results in a stationary wave of the injected light within the intermediate layer. The injected light is then absorbed into the active layer 25 thereby carriers are generated. The generated carriers make the device turn ON where the device is biased. Namely, the device is switched to ON state by the light injection. Then, an injection of electrical current into the active layer 25 appears and causes a population inversion state. In this state, recombinations of electrons and holes appear and therefor spontaneous emissions of lights are generated. The lights of the spontaneous emission are confined and resonated within the intermediate layer between the top and bottom distributed Bragg reflectors 22 and 28 so that an induced emission of a light having a wavelength is caused when an injection current is over the threshold current. The light generated by the induced emission is then transmitted through the n-GaAs substrate 21 as a laser beam.

The above mentioned device, however, has the following problems. The emission light or the laser beam generally has a different wavelength from that of the injection light. As mentioned above, the top and bottom distributed Bragg reflectors 28 and 22 are commonly used as the reflective mirrors for the injection right and the emission light. When the top and bottom distributed Bragg reflectors 28 and 22 as the reflective mirrors are designed to be optimized to the wavelength of the emitting light or the laser beam to obtain a great efficiency of light emission, such reflective mirrors are necessarily mismatched to the wavelength of the injection light. This provides a low efficiency of absorption of the injection light. This also provides undesirable limitation to the absorption wavelength range of the device. It is therefore impossible to design the device highly sensitive to an injection light having a different wavelength from that of the emitting laser beam. This also provides undesirable limitation of area of the light absorption. The above problems are caused by the common structure of the reflective mirrors for the injection light and the emission light, both of which have different wavelengths from each other.

To combat the above serious problems, a discrete integrated optical device comprising a heterojunction photo-transistor (HPT) and a surface emitting laser device (SEL device) had been proposed and disclosed in Electronics Letters 1991, vol. 27, pp. 216–217. With reference to FIGS. 2A and 2B, the device comprises the heterojunction photo-transistor (HPT) and the surface emitting laser device (SEL device). The surface emitting laser device comprises n-type and p-type reflective mirrors and intermediate layer sandwiched between the reflective mirrors. Each of the reflective mirrors comprises plural periods of alternative laminations of AlGaAs layers and AlAs layers. The intermediate layer comprises multiple quantum well active layer of alternative laminations of GaAs layers and AlGaAs layers. The heterojunction phototransistor makes an absorption of the injection light at its base and collector regions and therefor an electrical current is generated. As the phototransistor is biased, the electrical current flows through the surface emitting laser device. The electrical current is injected and absorbed into the multiple quantum well active layer thereby a spontaneous emission of light is caused. The light generated by the spontaneous emission of light is confined and resonated in the active layer between the reflective mirrors so that an induced emission of light or laser beam appears.

The heterojunction photo-transistor serves as a light detecting element, but insensitive to an ideal wide range wavelength of the injection lights. The above conventional heterojunction photo-transistor is required to have a sensitivity to much more wide range of wavelength of the injection light. The heterojunction photo-transistor also provides a poor efficiency of absorption of the injection light.

The light injection and emission are accomplished through the opposite side to the substrate on which the surface emitting laser device and the heterojunction photo-transistor are integrated. This makes impossible to form a heat radiation structure at the device side opposite to the substrate side, for which reason a heat generated by the laser emission or light injection tends to be accumulated in the device portion. As the integration of the optical devices has a high density, the problem with the heat accumulation within the optical device becomes serious. This renders it difficult to improve a high density integration of the two-dimensional array of the optical devices.

Other type of discrete integrated optical device comprising a heterojunction photo-transistor (HPT) and a surface emitting laser device (SEL device) had been proposed and disclosed in IEEE Photonics Technology Letters, May 1992, vol. 4, No. 5, pp. 479–482. With reference to FIG. 3, the device comprises the heterojunction photo-transistor (HPT) and the surface emitting laser device (SEL device), both of which are integrated on a substrate in parallel to serve as a NOR logic device. The surface emitting laser device comprises n-type and p-type reflective mirrors and an intermediate layer sandwiched between the reflective mirrors. The heterojunction photo-transistor makes an absorption of the injection light at its base and collector regions and therefor an electrical current is generated. As the phototransistor is biased, the electrical current flows through the surface emitting laser device. The electrical current is injected and absorbed into the active layer thereby a spontaneous emission of light is caused. The light generated by the spontaneous emission of light is confined and resonated in the active layer between the reflective mirrors so that an induced emission of light or laser beam appears.

The above optical device also has the following disadvantages. The heterojunction photo-transistor serves as a light detecting element, Put insensitive to an ideal wide range wavelength of the injection lights. The above conventional heterojunction photo-transistor is required to have a sensitivity to much more wide-range of wavelength of the injection light. The heterojunction photo-transistor also provides a poor efficiency of absorption of the injection light.

The light injection and emission are accomplished through the opposite side to the substrate on which the surface emitting laser device and the heterojunction photo-transistor are integrated. This makes impossible to form a heat radiation structure at the device side opposite to the substrate side, for which reason a heat generated by the laser emission or light injection tends to be accumulated in the device portion. As the integration of the optical devices has a high density, the problem with the heat accumulation within the optical device becomes serious. This renders it difficult to improve a high density integration of the two-dimensional array of the optical devices.

It is therefore required to develop an optical integrated device for emitting and detecting lights which is completely free from the above problems with the conventional device.

SUMMARY OF THE INVENTION

Accordingly, it is a primary object of the present invention to provide a novel semiconductor optical integrated device for detecting and emitting lights.

It is an additional object of the present invention to provide a novel semiconductor optical integrated device for detecting and emitting lights, which is usable for parallel optical processing and parallel optical transmissions.

It is a further object of the present invention to provide a novel semiconductor optical integrated device for detecting and emitting lights, which possesses a great stability of a detecting operation.

It is a further more object of the present invention to provide a novel semiconductor optical integrated device for detecting and emitting lights, which possesses a sensitivity to injection lights in a wide-range of wavelengths.

It is a still further object of the present invention to provide a novel semiconductor optical integrated device for detecting and emitting lights, which shows a high speed performance of detecting and emitting operations.

It is yet a further object of the present invention to provide a novel semiconductor optical integrated device for detecting and emitting lights, which is suitable for two-dimensional integration at a high density.

It is an additional object of the present invention to provide a novel semiconductor optical integrated device for detecting and emitting lights, which is free from a heat accumulation caused by laser emission and electrical and optical currents flowing through the device.

The above and other objects, features and advantages of the present invention will be apparent from the following descriptions.

The present invention provides a semiconductor optical surface transmission device comprising a semiconductor substrate, a light emitting element provided on the semiconductor substrate for emitting lights through the semiconductor substrate and a light detecting element provided on the semiconductor substrate for detecting lights injected through the semiconductor substrate. The light emission element has first and second reflective mirror elements and a first intermediate layer sandwiched between the first and second reflective mirror elements. The first intermediate layer includes an active layer and has a thickness of approximately integer times of a wavelength of an emission light. The detecting element has third and fourth reflective mirror elements with the same structures as structures of the first and second reflective mirror elements and a second intermediate layer with the same structure as a structure of the first intermediate layer. The second intermediate layer is sandwiched between the third and fourth reflective mirror elements. The second intermediate layer includes an absorption layer and has a thickness of approximately integer times of the wavelength of the emission light. The semiconductor optical surface transmission device is provided with a phase inversion layer in the fourth reflective mirror element of the light detecting element for inverting a phase of a light confined between the third and fourth reflective mirror elements to form a double resonator in the light detecting element.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
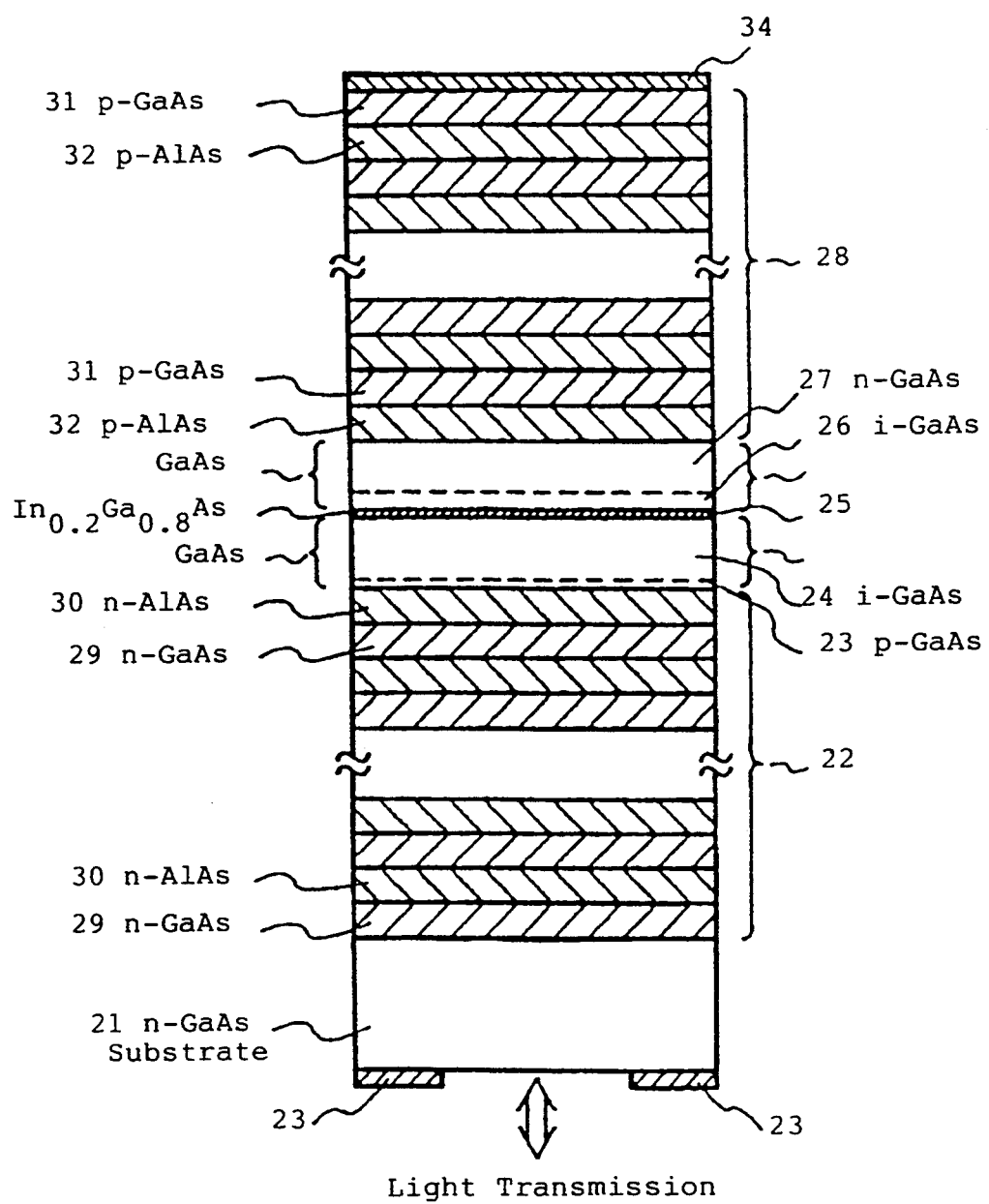
FIG. 1 is a cross sectional elevation view illustrative of the conventional semiconductor light transmission device.
Figure 2B:
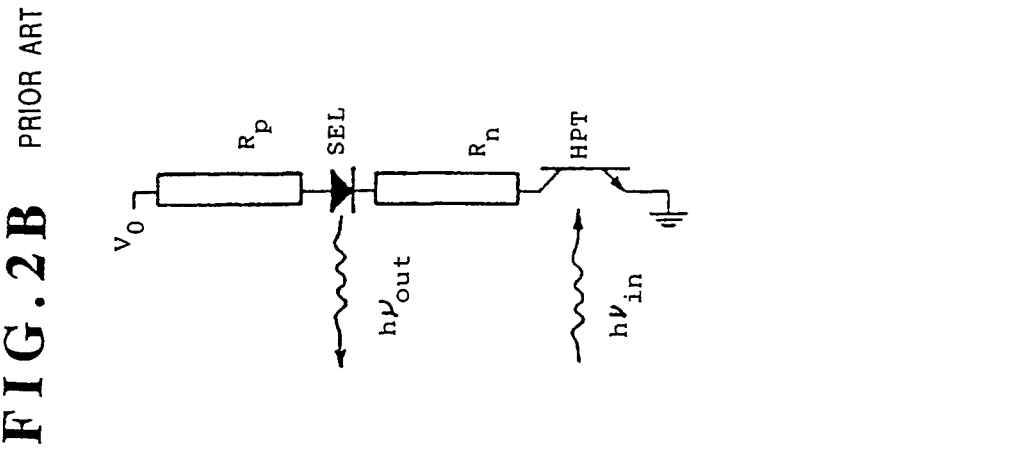
FIG. 2B is a circuit diagram of the conventional semiconductor light detection and emission device as illustrated in FIG. 2A.
Figure 2A:
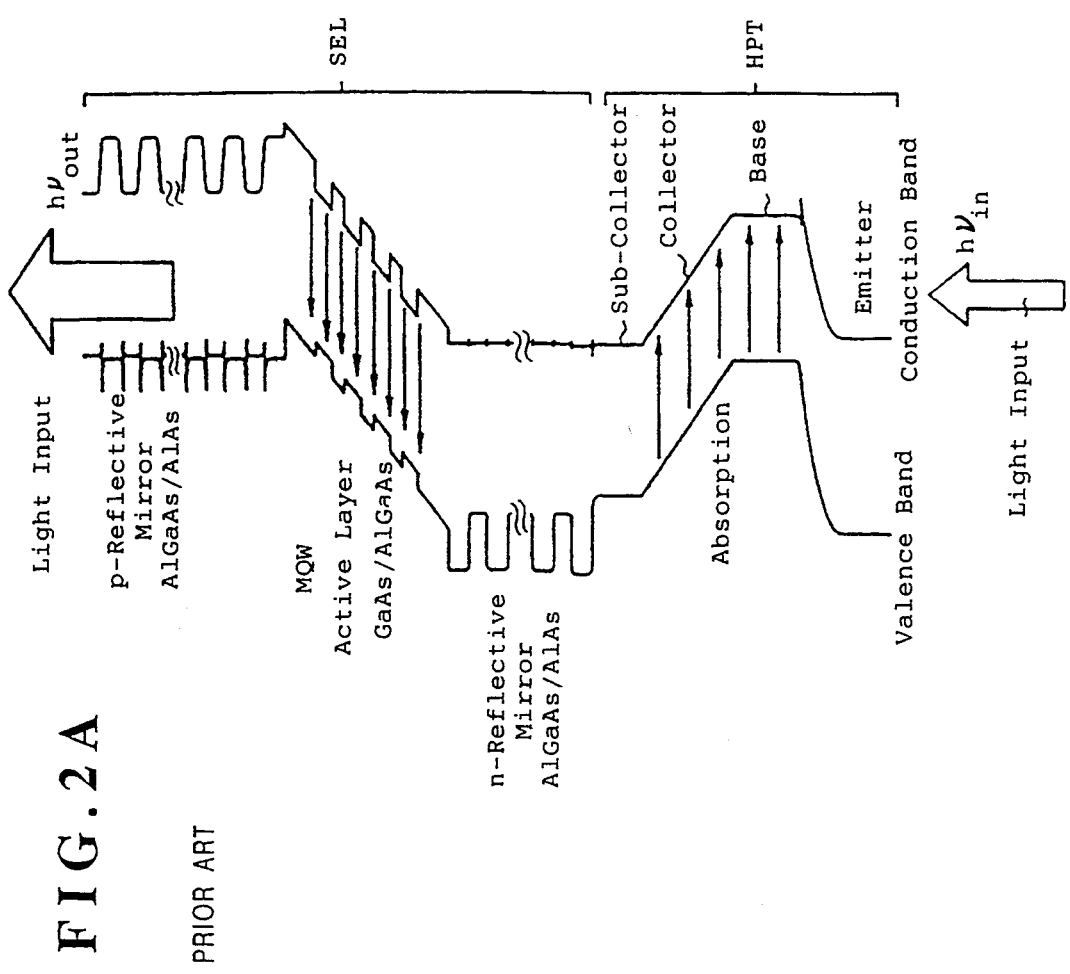
FIG. 2A is a diagram illustrative of energy band gaps of the conventional semiconductor light detection and emission device comprising the surface emitting laser and the heterojunction photo-transistor.
Figure 3:
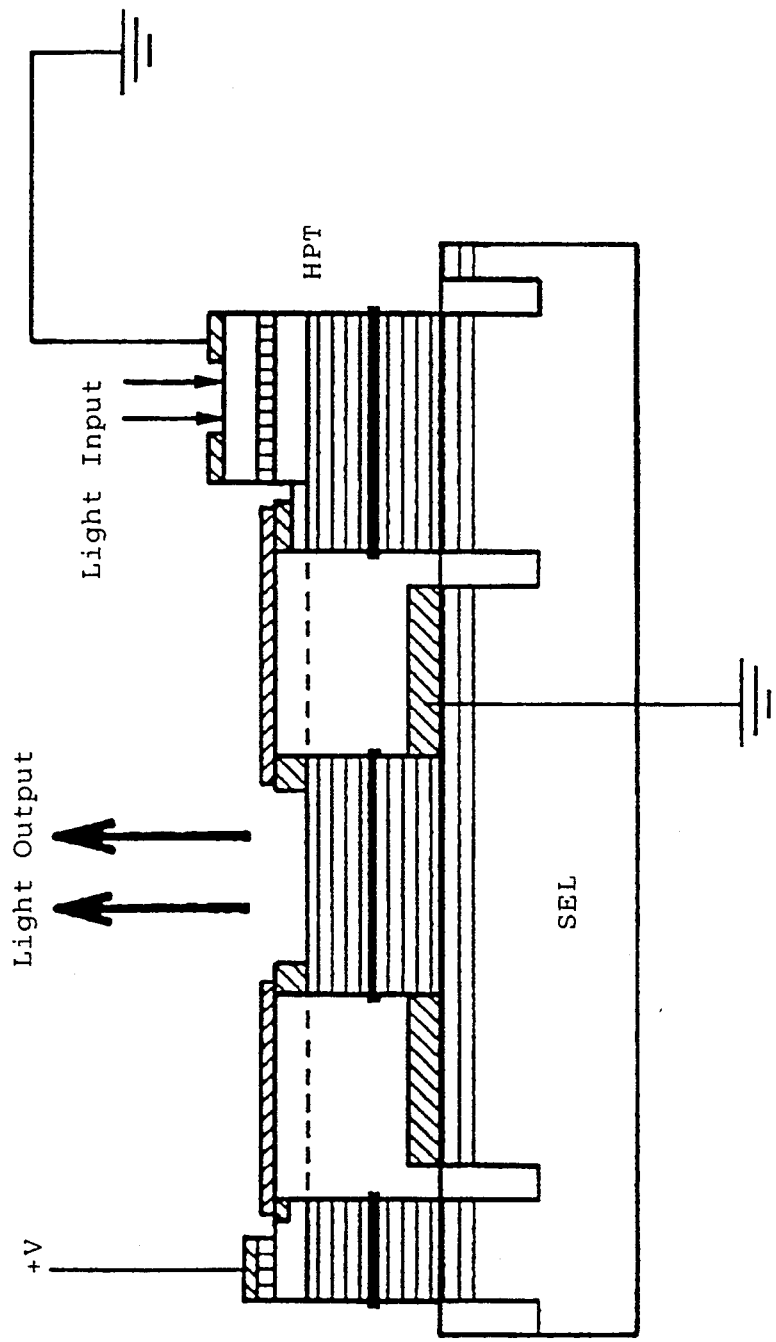
FIG. 3 is a cross sectional elevation view illustrative of the other conventional semiconductor light transmission device.
Figure 4:
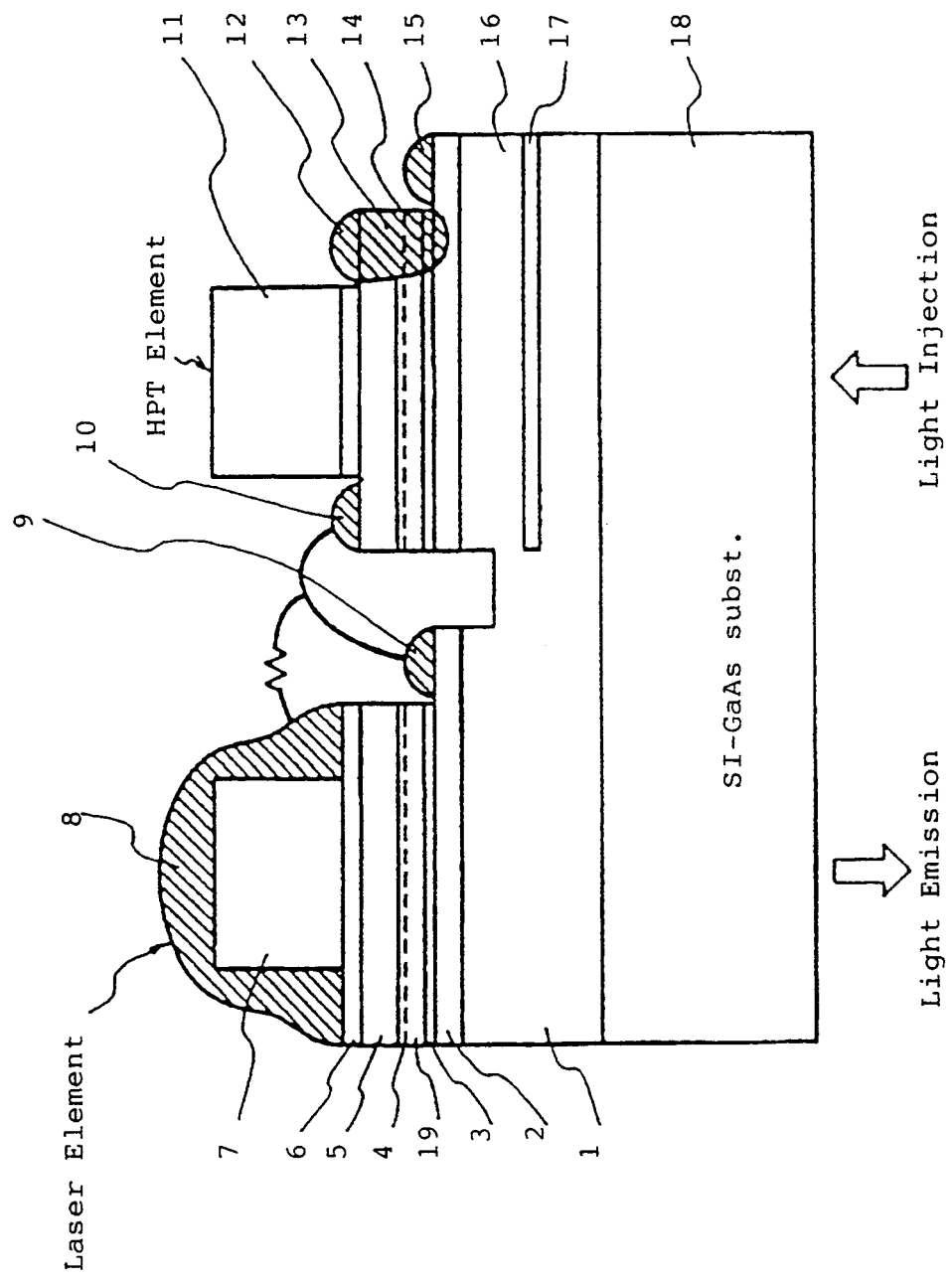
FIG. 4 is a cross sectional elevation view illustrative of a novel semiconductor optical integrated device comprising a laser element and a heterojunction phototransistor element of a preferred embodiment according to the present invention.

The present invention provides a novel optical integrated device which comprises a light emitting element portion and a light detecting element portion as illustrated in FIG. 4. The optical integrated device of the present invention is usable for parallel optical processing and parallel optical transmissions of data. The light detecting element portion is so designed as sensitive to a wide-range of wavelengths of injection lights so that the optical integrated device possesses a great stability of detecting operation. The light emitting element portion shows a laser emission by a relatively low threshold current so that the optical integrated device exhibits a high speed performance of its operations. The optical integrated device is also suitable for two-dimensional integration of arrays at a high density. The optical integrated device is further free from any heat accumulation caused by light or laser emission.

Figure 5:
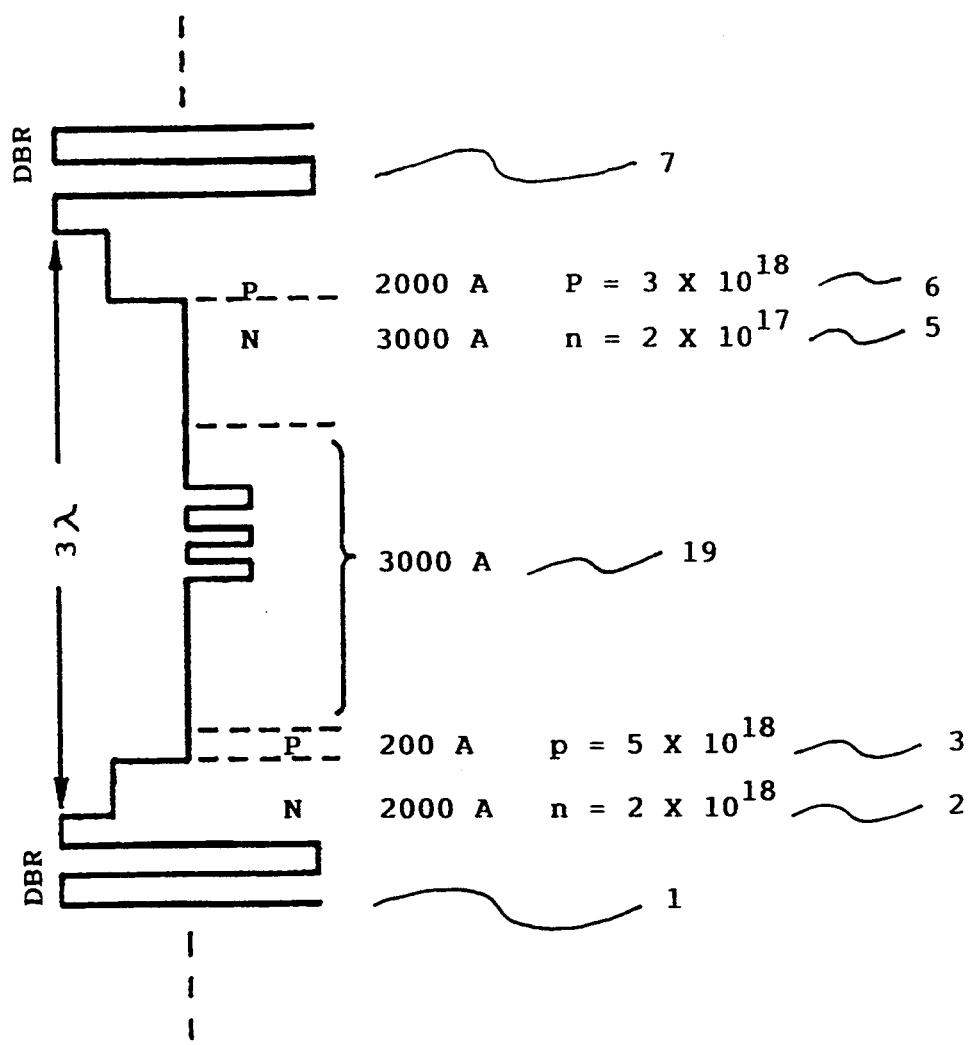
FIG. 5 is a diagram illustrative of energy band gaps of the laser element in the optical integrated device illustrated in FIG. 4.

A structure of the optical integrate device of a preferred embodiment of the present invention will be described with reference to FIG. 4. The optical integrated device comprises a laser element portion and a heterojunction photo-transistor element portion, both of which are formed on a semi-insulating GaAS substrate 18. The laser element portion comprises bottom and top distributed Bragg reflectors 1 and 7 which serve as reflecting mirrors and an intermediate layer sandwiched between the bottom and top distributed Bragg reflectors 1 and 7. The intermediate layer comprises an n-$Al_{0.4}Ga_{0.6}As$ layer 2 formed on a top surface of the bottom distributed Bragg reflector 1, a p-$Al_{0.25}Ga_{0.75}As$ layer 3 formed on the n-$Al_{0.4}Ga_{0.6}As$ layer 2, a non-doped $Al_{0.25}Ga_{0.75}As$ layer 19 formed on the p-$Al_{0.25}Ga_{0.75}As$ layer 3, an n-$Al_{0.25}Ga_{0.75}As$ layer 5 formed on the non-doped $Al_{0.25}Ga_{0.75}As$ layer 19 and a p-$Al_{0.4}Ga_{0.6}As$ layer 6 formed on the n-$Al_{0.25}Ga_{0.75}As$ layer 5. As mentioned above, the intermediate layer is so constructed as being photo-thyristor. The non-doped $Al_{0.25}Ga_{0.75}As$ layer 19 includes three active layers 4 made of $In_{0.2}Ga_{0.8}Al$, each of which has a thickness of 100 angstroms. As illustrated in FIG. 5, the n-$Al_{0.4}Ga_{0.6}As$ layer 2 has a thickness of 2000 angstroms and a doping concentration of $2 \times 10^{18}$ cm$^{-3}$. The p-$Al_{0.25}Ga_{0.75}As$ layer 3 has a thickness of 200 angstroms and a doping concentration of $5 \times 10^{18}$ cm$^{-3}$. The n-$Al_{0.25}Ga_{0.75}As$ layer 5 has a thickness of 3000 angstroms and a doping concentration of $2 \times 10^{17}$ cm$^{-3}$. The p-$Al_{0.4}Ga_{0.6}As$ layer 6 has a thickness of 2000 angstroms and a doping concentration of $3 \times 10^{18}$ cm$^{-3}$. The intermediate layer 19 has a thickness of 3000 angstroms. As illustrated in FIG. 5, the three active layers 4 made of $In_{0.2}Ga_{0.8}Al$ are so provided as to form a multiple quantum well structure in the intermediate layer 19. It is important not to provide the three $In_{0.2}Ga_{0.8}Al$ active layers 4 at surface portions of the intermediate layer 19 so that the active layer 4 contacts with nether the p-$Al_{0.25}Ga_{0.75}As$ layer 3 nor the n-$Al_{0.25}Ga_{0.75}As$ layer 5. A position of the multiple quantum well structure in the intermediate layer 19 is variable under the condition mentioned above. The intermediate layer 19 is required to have a thickness of integer time of a wavelength of light within the intermediate layer 19 so as to allow the light confined by the reflective mirrors to have a stationary wave. The n-$Al_{0.4}Ga_{0.6}As$ layer 2, the p-$Al_{0.25}Ga_{0.75}As$ layer 3, the n-$Al_{0.25}Ga_{0.75}As$ layer 5 and the p-$Al_{0.4}Ga_{0.6}As$ layer 6 serve as guide layers for confining electrical and optical currents in the active layer 4. In this preferred embodiment, the intermediate layer 19 is so designed as to have a thickness of three times of a wavelength of the light in the intermediate layer 19, for example 0.3 micrometers when the resonant wavelength is 9800 angstroms.

The bottom distributed Bragg reflector 1 comprises 22.5 pairs of alternative laminations of n-GaAs layers and n-AlAs layers. The n-GaAs layer and the n-AlAs layer have thicknesses of 672 angstroms and 804 angstroms. The top distributed Bragg reflector 7 comprises 15 pairs of alternative laminations of p-GaAs layers and p-AlAs layers. The p-GaAs layer and the p-AlAs layer have thicknesses of 672 angstroms and 804 angstroms.

The laser element portion is biased through a p-side electrode 8 and an n-side electrode 9. The p-side electrode 8 is provided on the p-$Al_{0.4}Ga_{0.6}As$ layer 6 and the top distributed Bragg reflector 7. The n-side electrode 9 is provided on a part of the n-$Al_{0.4}Ga_{0.6}As$ layer 2.

The heterojunction photo-transistor element portion comprises bottom and top distributed Bragg reflectors 16 and 11 which serve as reflecting mirrors and the intermediate layer sandwiched between the bottom and top distributed Bragg reflectors 16 and 11. The intermediate layer comprises the same structure as the structure of the laser portion. Namely, the intermediate layer comprises the n-$Al_{0.4}Ga_{0.6}As$ layer 2 formed on the top surface of the bottom distributed Bragg reflector 1, the p-$Al_{0.25}Ga_{0.75}As$ layer 3 formed on the n-$Al_{0.4}Ga_{0.6}As$ layer 2, the non-doped $Al_{0.25}Ga_{0.75}As$ layer 19 formed on the p-$Al_{0.25}Ga_{0.75}As$ layer 3, the n-$Al_{0.25}Ga_{0.75}As$ layer 5 formed on the non-doped $Al_{0.25}Ga_{0.75}As$ layer 19 and the p-$Al_{0.4}Ga_{0.6}As$ layer 6 formed on the n-$Al_{0.25}Ga_{0.75}As$ layer 5. The intermediate layer forms the bipolar transistor. The n-$Al_{0.4}Ga_{0.6}As$ layer 2 serves as an emitter region of the heterojunction photo-transistor. The p-$Al_{0.25}Ga_{0.75}As$ layer 3 serves as a base region and has such a thickness as to reduce a resistance of the base region. The non-doped $Al_{0.25}Ga_{0.75}As$ layer 19 includes three absorption layers 14 made of $In_{0.2}Ga_{0.8}Al$, each of which has a thickness of 100 angstroms.

The top distributed Bragg reflector 11 comprises 15 pairs of alternative laminations of p-GaAs layers and p-AlAs layers. The p-GaAs layer and the p-AlAs layer have thicknesses of 672 angstroms and 804 angstroms. The top distributed Bragg reflector 11 has a doping concentration of $2 \times 10^{18}$ cm$^{-3}$.

The bottom distributed Bragg reflector 16 has an analogous structure to that of the bottom distributed Bragg reflector 1 of the laser element portion, except for a phase inversion layer 17. The bottom distributed Bragg reflector 16 has a doping concentration of $3 \times 10^{18}$ cm$^{-3}$. The bottom distributed Bragg reflector 16 comprises 22.5 pairs of alternative laminations of n-GaAs layers and n-AlAs layers, except for the sixteenth layer from the bottom. The sixteenth layer from the bottom in the bottom distributed Bragg reflector 16 is the phase inversion layer 17. Existence of the phase inversion layer 17 in the bottom distributed Bragg reflector 16 provides a double resonator. The n-GaAs layer and the n-AlAs layer have thicknesses of 672 angstroms and 804 angstroms.

In this embodiment, the first layer from the bottom in the bottom distributed Bragg reflector 16 comprises the n-AlAs layer and the fifteenth layer from the bottom therein thus comprises the n-AlAs layer. The phase inversion layer 17 as the eighteenth layer from the bottom therein comprises an n-GaAs layer having a thickness of two times of the thickness of the GaAs layer. The thickness of the inversion layer 17 is thus 1344 angstroms. The nineteenth layer from the bottom in the bottom distributed Bragg reflector 16 comprises the n-AlAs layer having the thickness of 804 angstroms.

Alternatively, it is available that the first layer from the bottom in the bottom distributed Bragg reflector 16 comprises the n-GaAs layer and the fifteenth layer from the bottom therein thus comprises the n-GaAs layer. In this alternative case, the phase inversion layer 17 as the eighteenth layer from the bottom therein comprises an n-AlAs layer having a thickness of two times of the thickness of the AlAs layer. The thickness of the inversion layer 17 is thus 1608 angstroms. The nineteenth layer from the bottom in the bottom distributed Bragg reflector 16 comprises the n-GaAs layer having the thickness of 672 angstroms.

Figure 6:
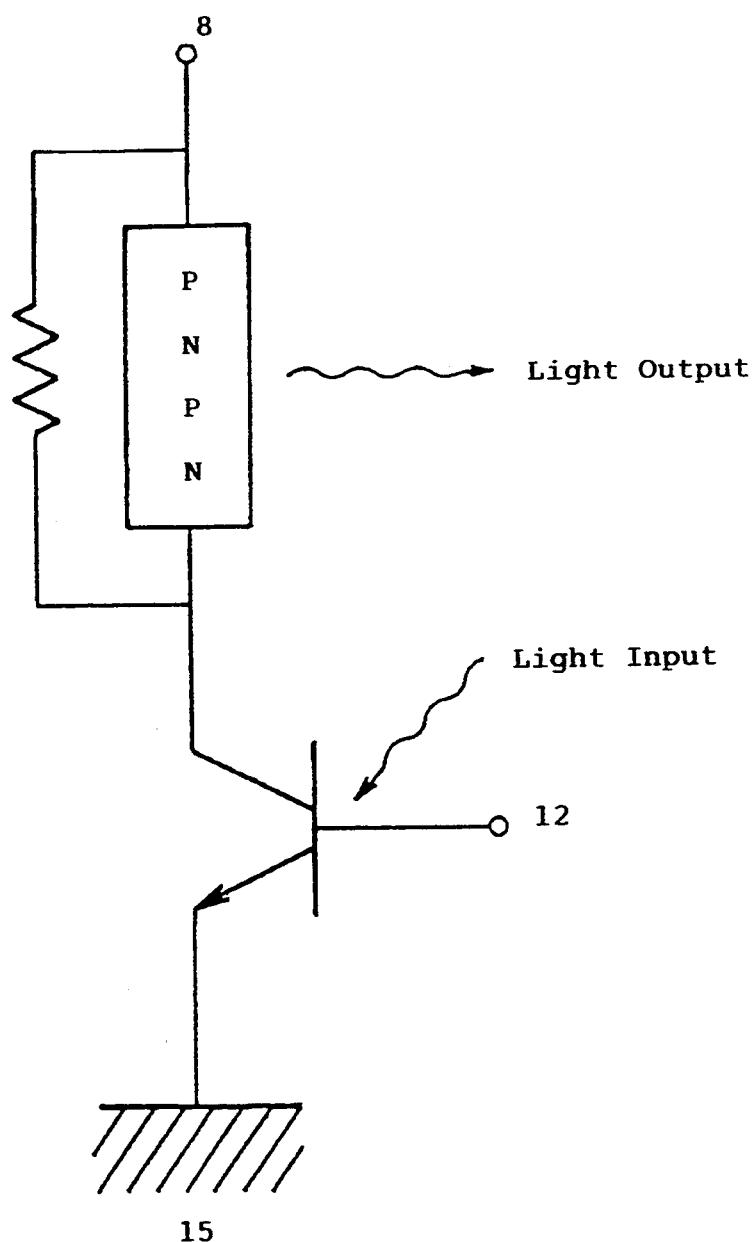
FIG. 6 is a circuit diagram of the novel semiconductor optical integrated device illustrated in FIG. 4.

An emitter electrode 15 is provided on the emitter region as the n-$Al_{0.4}Ga_{0.6}As$ layer 2. A collector electrode 10 is provided on the collector region as the n-$Al_{0.25}Ga_{0.75}As$ layer 5. A base electrode 12 is provided on the n-$Al_{0.25}Ga_{0.75}As$ layer 5 and electrically connected to the base layer as the p-$Al_{0.25}Ga_{0.75}As$ layer 3 through a Zn diffusion region 13. The collector electrode 10 of the heterojunction photo-transistor element portion is electrically connected to the n-side electrode 9 of the laser element portion through an interconnection. A resistance of 5000 ohm is connected between the p-side and n-side electrodes 8 and 9 in parallel to the thyristor in the laser portion. As illustrated in FIG. 6, the emitter electrode 15 of the heterojunction photo-transistor element portion is grounded and the p-side electrode 8 of the laser element portion is applied with a positive voltage so that the optical device is biased through the p-side electrode 8 and the emitter electrode 15.

The optical integrated device may be fabricated by molecular beam epitaxy and etching. In fabrication processes of the optical integrated device, the bottom distributed Bragg reflectors 1 and 16 of the laser element portion and the heterojunction photo-transistor element portion may concurrently be grown by the molecular beam epitaxy. The intermediate layers of the laser element portion and the heterojunction photo-transistor element portion may also concurrently be grown by the molecular beam epitaxy. The top distributed Bragg reflectors 7 and 11 of the laser element portion and the heterojunction photo-transistor element portion may also concurrently be grown by the molecular beam epitaxy. After that, the layers are etched to form the electrodes. Although in this embodiment the intermediate layers of the laser element portion and the heterojunction photo-transistor element portion are designed as to have the same thickness, the thicknesses of the intermediate layers may be designed as to have different thicknesses from each other, provided that the both thicknesses of the intermediate layers are integer times of the wavelength of the light confined by the reflective mirrors of the laser element portion.

Figure 7A:
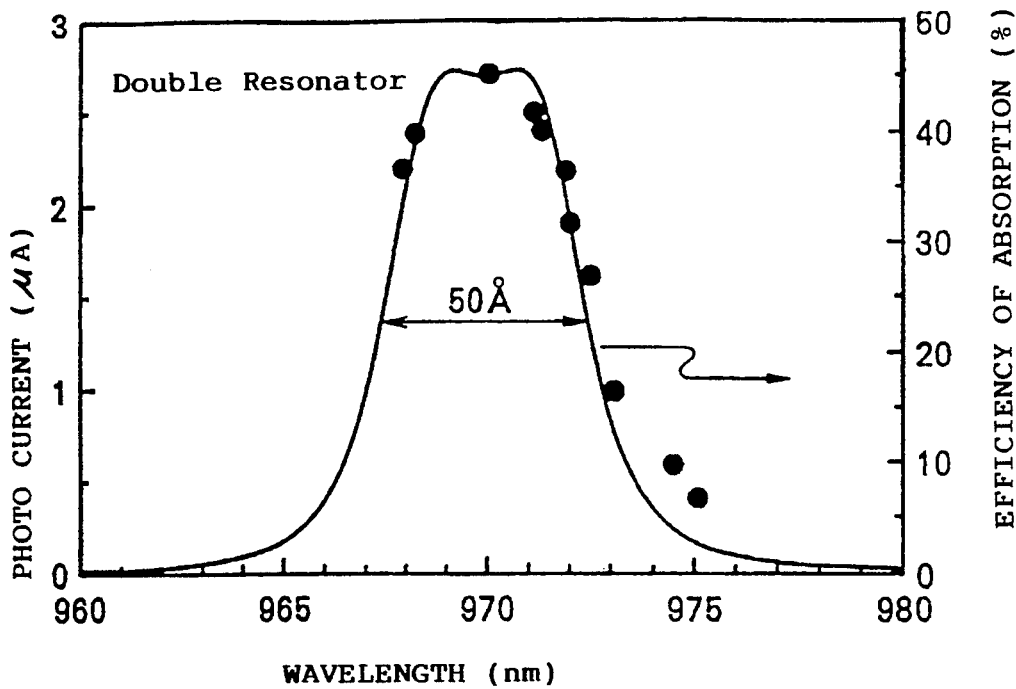
FIG. 7A is a diagram illustrative of an efficiency of an absorption of lights and a photo current value of a heterojunction photo-transistor in the optical integrated device illustrated in FIG. 4.
Figure 7B:
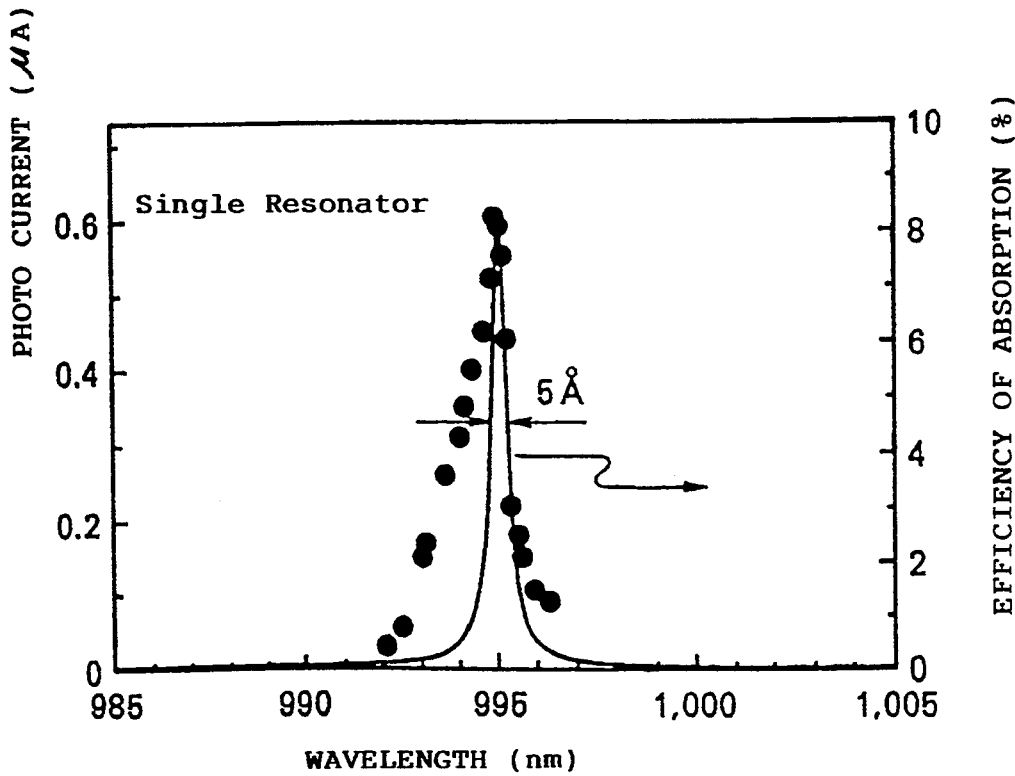
FIG. 7B is a diagram illustrative of an efficiency of an absorption of lights and a photo current value of the conventional heterojunction photo-transistor in the conventional optical integrated device.

Operations of the optical integrated device will subsequently be described. Light transmissions are accomplished through the semi-insulating GaAs substrate 18. A light is injected into the heterojunction photo-transistor element portion through the semi-insulating GaAs substrate 18. The injected light is transmitted through the bottom distributed Bragg reflector 16 including the phase inversion layer 17 to the intermediate layer as the photo-transistor portion. When the light passes through the multiple quantum well, the light is then absorbed into the absorption layers 14. The efficiency of the absorption of the light in various wavelength of the light is as illustrated in FIG. 7A, from which it is appreciated that the absorption layers 14 are able to absorb lights having wavelength in a wide range of 50 angstroms. The wide range absorption of the light is permitted by the double resonator or the existence of the phase inversion layer 17 in the bottom distributed Bragg reflector 16 of the heterojunction photo-transistor element portion. FIG. 7B illustrates an efficiency of the light absorption and the photo current value in a single resonator which has been used in the conventional optical transmission device. From FIGS. 7A and 7B, it will readily be appreciated that the double resonator provided by the phase inversion layer 17 according to the present invention may provide a superior light absorption property. In the single resonator of the prior arts, the light absorption appears in a narrower range of 5 angstroms of the injection light wavelength. In the single resonator, the absorption efficiency of the injection light is low, for example, the maximum value of the absorption efficiency is approximately 8%. In contrast, the double resonator provided by the phase inversion layer 17 is able to show the following superior properties of the absorption of the injection light. The double resonator provided by the phase inversion layer 17 thus makes an absorption of the injection light at a high efficiency in a much wider range of 50 angstroms of the wavelength of the injection light. The maximum value of the absorption efficiency of the injection light is over 40%. As compared to the single resonator, the double resonator provided by the phase inversion layer 17 further allows much lager photo current to be confined between the reflective mirrors. The double resonator of the present invention provides remarkable improvements in the detecting range of the wavelength of the light and the maximum value of the absorption efficiency of the injection light. This permits the heterojunction photo-transistor element to be sensitive to the light in the much wider wavelength range of the injection light. Although the injection light has somewhat of a variation of the wavelength, the heterojunction photo-transistor with the double resonating structure is sensitive to such a light as having a variation of the wavelength. Then, a great stability of the light absorption as the light detecting operation is obtained.

A principal of the expansion of the detecting range of the wavelength of the injection light will simply be described. When plural resonators so designed as to show a resonance in the same wavelength are provided through potential barriers, a split of the resonant wavelength appears. This is appreciable from the following matters. When a plurality of quantum wells are connected through potential barriers, a degeneracy is removed and therefor some energy levels and sub-bands are generated. Each of the split resonant energy level lines has a width defined by a reciprocal number of a life-time of photon confined by the reflective mirrors. A difference of resonant wavelengths is defined by a reciprocal number of tame for a movement of a photon from a state in which the photon exists in a resonator to another state in which the photon exists in another resonator. As the number of layers of the distributed Bragg reflector as the reflective mirror is increased, the width of the resonant energy level line becomes narrow. As the cavity length or the distance between the distributed Bragg reflectors becomes large, a distance of the resonant energy level lines becomes narrow. The cavity length and the total number of the distributed Bragg reflectors are suitably selected to obtain a possible flat gain spectrum.

A vertical position of the phase inversion layer 17 in the bottom distributed Bragg reflector 16 is variable. When the position of the phase inversion layer 17 in the bottom distributed Bragg reflector 16 is moved to an upper position, the detecting range of the wavelength of the injection light becomes more wide but the maximum value of the absorption efficiency of the injection light is reduced. In contrast, when the position of the phase inversion layer 17 in the bottom distributed Bragg reflector 16 is moved to an under position, the detecting range of the wavelength of the injection light becomes narrow but the maximum value of the absorption efficiency of the injection light becomes large.

The absorption of the injection light into the absorption layer 14 of the heterojunction photo-transistor generates carriers or electrons and holes. Since the photo-transistor is biased, an electrical current of electrons flows through the collector electrode 10 and then through the interconnection to the n-side electrode 9 of the laser element portion. Since the thyristor of the laser element portion is also biased, the electron current flows through the intermediate layer to the p-side electrode 8 of the laser element portion. When the electron current passes through the active layers 4 as the multiple quantum well structure, the active layer 4 shows the population inversion thereby the recombination of electrons and holes appears. The electron-hole recombination causes a spontaneous emission of light. When the injection current into the active layer 4 is over the threshold current, an induced emission of light appears. The light is confined and resonated in the intermediate layer between the top and bottom distributed Bragg reflectors 7 and 1 so that the laser emission appears through the semi-insulating GaAs substrate 18. The laser element of the optical integrated device possesses a low threshold current property. This permits the optical integrated device to show a high speed performance of the light detecting and emitting operations. Since the light transmission is made through the semi-insulating GaAs substrate 18, the optical integrated device of the present invention allows a flip chip bonding at its element side opposite to the substrate side. This makes the optical integrated device of the present invention free from the problems with the heat accumulation caused by the laser emission and optical and electrical currents.

According to the present invention, the cavity length defined between the bottom and top distributed Bragg reflectors 1 and 7 is so designed as to match integer times of the wavelength of the emission light. Although the injection light has a different wavelength from the wavelength of the emission light and a variation of the wavelength, the phase inversion layer 17 permits the photo-transistor to show the absorption of the injection light at the high efficiency.

Although the optical integrated device of the preferred embodiment according to the present invention is made of GaAs group semiconductor materials, other semiconductor materials such as InP are also available for the optical integrated device of the present invention.

Whereas modifications of the present invention will no doubt be apparent to a person having ordinary skill in the art, it is to be understood that the embodiments shown and described by way of illustrations are by no means intended to be considered in a limiting sense. Accordingly, it is to be intended to cover by claims all modifications of the present invention which fall within the sprit and scope of the invention.

What is claimed is:

1. A semiconductor optical surface transmission device comprising:

a semiconductor substrate;

an element provided on said semiconductor substrate for emitting a light through said semiconductor substrate, said light emission element having first and second reflective mirror elements and a first intermediate layer sandwiched between said first and second reflective mirror elements and said first intermediate layer including an active layer and having a thickness of approximately integer times of a wavelength of an emission light;

an element provided on said semiconductor substrate for detecting a light injected through said semiconductor substrate, said detecting element having third and fourth reflective mirror elements with the same structures as structures of said first and second reflective mirror elements and a second intermediate layer with the same structure as a structure of said first intermediate layer, said second intermediate layer being sandwiched between said third and fourth reflective mirror elements and said second intermediate layer including an absorption layer and having a thickness of approximately integer times of the wavelength of the emission light; and means provided in said fourth reflective mirror element for inverting a phase of a light confined between said third and fourth reflective mirror elements to form a double resonator in said light detecting element.

2. The device as claimed in claim 1, wherein said first, second, third and fourth reflective mirror elements comprise distributed Bragg reflectors formed by alternative laminations of first semiconductor layers and second semiconductor layers having a wider energy band gap than an energy band gap of said first semiconductor layers.

3. The device as claimed in claim 2, wherein said first and second semiconductor layers comprise a GaAS layer and a AlAs layer respectively.

4. The device as claimed in claim 2, wherein said phase inverting means comprises a phase inversion layer having thicknesses of two times of the other first or second semiconductor layer of said fourth reflective mirror.

5. The device as claimed in claim 1, wherein said first and second intermediate layers have a thickness of three times of a wavelength of emission light.

6. The device as claimed in claim 1, wherein said first intermediate layer comprises a first layer of a first conductivity type, a second layer of a second conductivity type formed on said first layer, a non-doped third layer formed on said second layer and including three active layers to form a multiple quantum well structure, a fourth layer of the first conductivity type formed on said third non-doped layer and a fifth layer of the second conductivity type formed on said fourth layer.

7. The device as claimed in claim 1, wherein said second intermediate layer comprises a first layer of a first conductivity type, a second layer of a second conductivity type formed on said first layer, a non-doped third layer formed on said second layer and including three absorption layers to form a multiple quantum well structure, a fourth layer of the first conductivity type formed on said third non-doped layer and a fifth layer of the second conductivity type formed on said fourth layer.

* * * * *